(12) United States Patent
Seff et al.

(10) Patent No.: US 7,399,203 B2
(45) Date of Patent: *Jul. 15, 2008

(54) BASE ASSEMBLY, AND METER SOCKET ASSEMBLY AND METER CENTER EMPLOYING THE SAME

(75) Inventors: Paul D. Seff, Lincoln, IL (US); Jeffrey L. Johnson, Lincoln, IL (US); James L. Gehlbach, Lincoln, IL (US); Syed M. Karim, Lincoln, IL (US)

(73) Assignee: Eaton Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/560,110

(22) Filed: Nov. 15, 2006

(65) Prior Publication Data

US 2008/0113549 A1     May 15, 2008

(51) Int. Cl.
*H01R 33/945* (2006.01)
(52) U.S. Cl. ...................................................... 439/517
(58) Field of Classification Search ................. 439/517, 439/146, 167, 508, 188, 483, 160, 449; 361/659, 361/668–670, 661, 663, 102
See application file for complete search history.

(56) References Cited

U.S. PATENT DOCUMENTS

| | | | |
|---|---|---|---|
| 2,592,299 A | 4/1952 | Lewis | |
| 3,281,550 A | 10/1966 | Waldrop | |
| 3,764,956 A | 10/1973 | Norden | |
| 5,572,396 A | 11/1996 | Robinson | |
| 5,775,942 A | 7/1998 | Jeffcoat | |
| 6,012,937 A | 1/2000 | Campbell et al. | |
| 6,781,491 B2 | 8/2004 | Whipple et al. | |
| 6,846,199 B1 * | 1/2005 | Robinson et al. | 439/517 |
| 7,267,576 B1 * | 9/2007 | Seff et al. | 439/517 |
| 2002/0197896 A1 * | 12/2002 | Robinson | 439/146 |
| 2006/0063423 A1 | 3/2006 | Seff et al. | |

* cited by examiner

*Primary Examiner*—Edwin A. León
(74) *Attorney, Agent, or Firm*—Martin J. Moran

(57) ABSTRACT

A base assembly is provided for a meter socket assembly of a meter center including an enclosure having a panel member. The meter socket assembly includes a meter. The base assembly includes a base member having a first side coupled to the panel member, a second side disposed opposite and distal from the first side, and first and second ends. Meter jaws are disposed on the second side of the base member and receive the meter. Electrical bus members are coupled to the base member at or about the first side thereof, and are electrically connected to at least one of the meter jaws at or about the second side thereof. The electrical bus members are coupled to and supported by the base member of the base assembly, without the use of a number of separate fasteners. A meter socket assembly and meter center are also disclosed.

11 Claims, 5 Drawing Sheets

BASE ASSEMBLY, AND METER SOCKET ASSEMBLY AND METER CENTER EMPLOYING THE SAME

CROSS-REFERENCE TO RELATED APPLICATIONS

This application is related to commonly assigned, concurrently filed:

U.S. patent application Ser. No. 11/560,146, filed Nov. 15, 2006, entitled "Meter Socket Assembly and Quick Change Mechanism Therefor"; and U.S. patent application Ser. No. 11/560,074, filed Nov. 15, 2006, entitled "Electrical Bus Member and Meter Socket Assembly Employing the Same".

BACKGROUND OF THE INVENTION

1. Field of the Invention

The invention relates generally to meter centers for electrical power distribution systems and, more particularly, to base assemblies for the meter socket assemblies of meter centers. The invention also relates to meter socket assemblies for meter centers.

2. Background Information

Meter centers including a number of watt-hour meters are commonly used to measure electric power consumed by the tenant(s) of a residence (e.g., without limitation, a single family home; an apartment building) or commercial site (e.g., without limitation, an office complex).

FIGS. 1A and 1B show an example meter center 1. The meter center 1 includes an upright cabinet forming an enclosure 3. The enclosure 3 is divided by an internal longitudinal wall 5 into side-by-side meter and disconnect switch compartments 7,9 (disconnect switch compartment 9 is shown in FIG. 1A only). A pair of vertical supply buses 11A,11B (FIG. 1A) are electrically connected at one end to a meter socket assembly 13 within the meter compartment 7 and, at the other end, to an electrical switching apparatus, such as the circuit breaker 15 shown in FIG. 1A, within the disconnect switch compartment 9. The meter socket assembly 13 includes a meter socket 17 (FIG. 1B) for mounting a meter 19 (FIG. 1B) in the meter compartment 7 for each tenant load circuit, and to electrically connect the meter 19 (FIG. 1B) to line buses 21A, 21B (line bus 21A is shown in FIG. 1A only) which are electrically connected to the respective supply buses 11A, 11B (FIG. 1A). Meter centers and electrical bus work therefor are described in detail, for example, in U.S. Pat. No. 6,012,937 (Campbell et al.), which is hereby incorporated herein by reference.

The meter socket assembly 13 of FIGS. 1A and 1B is designed to be interchangeable between an underground feed configuration (shown), and an overhead feed configuration (not shown). In the underground feed configuration, the utility lines (not shown) are routed to the meter center 1 underground and are typically fed through the bottom (from the perspective of FIGS. 1A and 1B) of the meter center enclosure 3 to be electrically connected at or about the lower end (from the perspective of FIGS. 1A and 1B) of the line buses 21A,21B (line bus 21A is shown in FIG. 1A only). In an overhead feed configuration, the utility lines (not shown) are routed to the meter center 1 above ground and are fed through the top (from the perspective of FIGS. 1A and 1B) of the meter center enclosure 3 to be electrically connected to the upper end (from the perspective of FIGS. 1A and 1B) of the line buses 21A,21B.

Each line bus 21A,21B has two twisted sections of about 90 degrees each, in order that the upper and lower ends of the line buses 21A,21B are horizontal (with respect to the plane of the back panel 27 of the meter cabinet 3) and the middle portions of the buses 21A,21B are vertical (with respect to the plane of the back panel 27 of the meter cabinet 3). As best shown in FIG. 1A, the vertical portion of each of the line buses 21A, 21B is side mounted to a corresponding individual base member 23A,23B by a pair of side-mount screws 25. These separate sub-assemblies, which together form the meter socket assembly 13, are then mounted to the back panel 27 of the meter cabinet 3 by first and second pedestal assemblies 29,31 (FIG. 1B). Each pedestal assembly 29,31 comprises multiple components and employs a plurality of fasteners 33. The first and second pedestal assemblies 29,31 are disposed at the upper (from the perspective of FIGS. 1A and 1B) and lower (from the perspective of FIGS. 1A and 1B) ends of the line buses 21A,21B, respectively. In addition to functioning as mounting brackets for mounting the meter socket assembly 13, the pedestal assemblies 29,31 also serve to support the line buses 21A,21B. A still further number of fasteners 35 (FIG. 1B) are required to secure wire connectors, commonly referred to as lugs 37, to the line buses 21A,21B for providing the electrical connection between the meter socket assembly 13 and, for example, the utility lines (not shown).

Accordingly, the meter socket assembly 13 has numerous separate components and fasteners 25,33,35 therefor. This makes assembly, repair, replacement, and/or maintenance of the meter socket assembly 13 difficult. For example, removal or replacement of the line buses 21A,21B would require the side-mount screws 25 (FIG. 1A) to be removed in four locations, the lug fasteners 35 and lugs 37 to be removed in two locations, and the line buses 21A,21B to be disengaged from both of the pedestals 29,31. The fasteners 25,33,35 could be lost and/or can strip or break during the above removal or replacement process. Also, access to some of the fasteners, such as the aforementioned side-mount fasteners 25 (FIG. 1A), is limited, and can require special tools to be used to loosen or tighten them. Furthermore, the twisted structure of the line buses 21A,21B unnecessarily uses more material than required.

There is, therefore, room for improvement in meter centers and in meter socket assemblies therefor.

SUMMARY OF THE INVENTION

These needs and others are met by embodiments of the invention, which are directed to an improved base assembly for the meter socket assemblies of a meter center which, among other advantages, employs a reduced number of components.

As one aspect of the invention, a base assembly is provided for a meter socket assembly of a meter center. The meter center includes an enclosure having a panel member, and the meter socket assembly is structured to receive a meter. The base assembly comprises: a base member including a first side, a second side disposed opposite and distal from the first side, a first end and a second end, the first side of the base member being structured to be coupled to the panel member of the enclosure of the meter center; a number of meter jaws disposed on the second side of the base member and being structured to receive the meter of the meter socket assembly; a number of electrical bus members, each of the electrical bus members being coupled to the base member at or about the first side of the base member and being electrically connected to at least one of the meter jaws at or about the second side of the base member. The electrical bus members are coupled to and supported by the base member of the base assembly, without the use of a number of separate fasteners.

The first side of the base member may comprise a number of channels, wherein each of the channels receives a corresponding one of the electrical bus members. The number of electrical bus members may comprise first and second electrical bus members, and the number of channels may comprise first and second channels, wherein the first and second channels are disposed on the first side of the base member and extend between the first end of the base member and the second end of the base member, and wherein the first and second electrical bus members are disposed within the first and second channels, respectively, and extend between the first end of the base member and the second end of the base member. The first side of the base member may further comprise a plurality of protrusions disposed at or about each of the first and second channels, wherein the protrusions are structured to retain the first and second electrical bus members within the first and second channels, respectively. The protrusions may comprise a pair of first molded tabs extending inwardly at or about the first end of the base member in order to at least partially overlay one of the first and second channels, a pair of second molded tabs extending inwardly at or about the second end of the base member in order to at least partially overlay such one of the first and second channels, a pair of third molded tabs extending inwardly at or about the first end of the base member in order to at least partially overlay the other one of the first and second channels, and a pair of fourth molded tabs extending inwardly at or about the second end of the base member in order to at least partially overlay such other one of the first and second channels.

Each electrical bus member may comprise a first portion extending outwardly from the first end of the base member, a second portion extending between the first side of the base member and the second side of the base member at or about the second end of the base member in order to be electrically connected to the at least one of the meter jaws on the second side of the base member, and an intermediate portion extending between the first end of the base member and the second end of the base member at or about the first side of the base member in order to interconnect the first portion of the electrical bus member and the second portion of the electrical bus member. Each electrical bus member may be a single piece of material, wherein the first portion of the electrical bus member, the second portion of the electrical bus member, and the intermediate portion of the electrical bus member are all integral sections of the single piece of material. Alternatively, each electrical bus member may comprise a first part, a second part, and a fastening mechanism structured to fasten the first part to the second part, wherein the first part of the electrical bus member comprises the first portion of the electrical bus member and the intermediate portion of the electrical bus member, and wherein the second part of the electrical bus member comprises the second portion of the electrical bus member. The base member may comprise a single piece electrically insulative member.

As another aspect of the invention, a meter socket assembly is provided for a meter center including an enclosure having a panel member. The meter socket assembly comprises: a meter; and a base assembly comprising: a base member including a first side, a second side disposed opposite and distal from the first side, a first end and a second end, the first side of the base member being structured to be coupled to the panel member of the enclosure of the meter center, a number of meter jaws disposed on the second side of the base member and receiving the meter of the meter socket assembly, a number of electrical bus members, each of the electrical bus members being coupled to the base member at or about the first side of the base member and being electrically connected to at least one of the meter jaws at or about the second side of the base member. The electrical bus members are coupled to and supported by the base member of the base assembly, without the use of a number of separate fasteners.

As another aspect of the invention, a meter center comprises: an enclosure including a panel member; and at least one meter socket assembly, each of the at least one meter assembly comprising: a meter, and a base assembly comprising: a base member including a first side, a second side disposed opposite and distal from the first side, a first end and a second end, the first side of the base member being coupled to the panel member of the enclosure of the meter center, a number of meter jaws disposed on the second side of the base member and receiving the meter of the at least one meter socket assembly, a number of electrical bus members, each of the electrical bus members being coupled to the base member at or about the first side of the base member and being electrically connected to at least one of the meter jaws at or about the second side of the base member. The electrical bus members are coupled to and supported by the base member of the base assembly, without the use of a number of separate fasteners.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figures 1A, 1B:
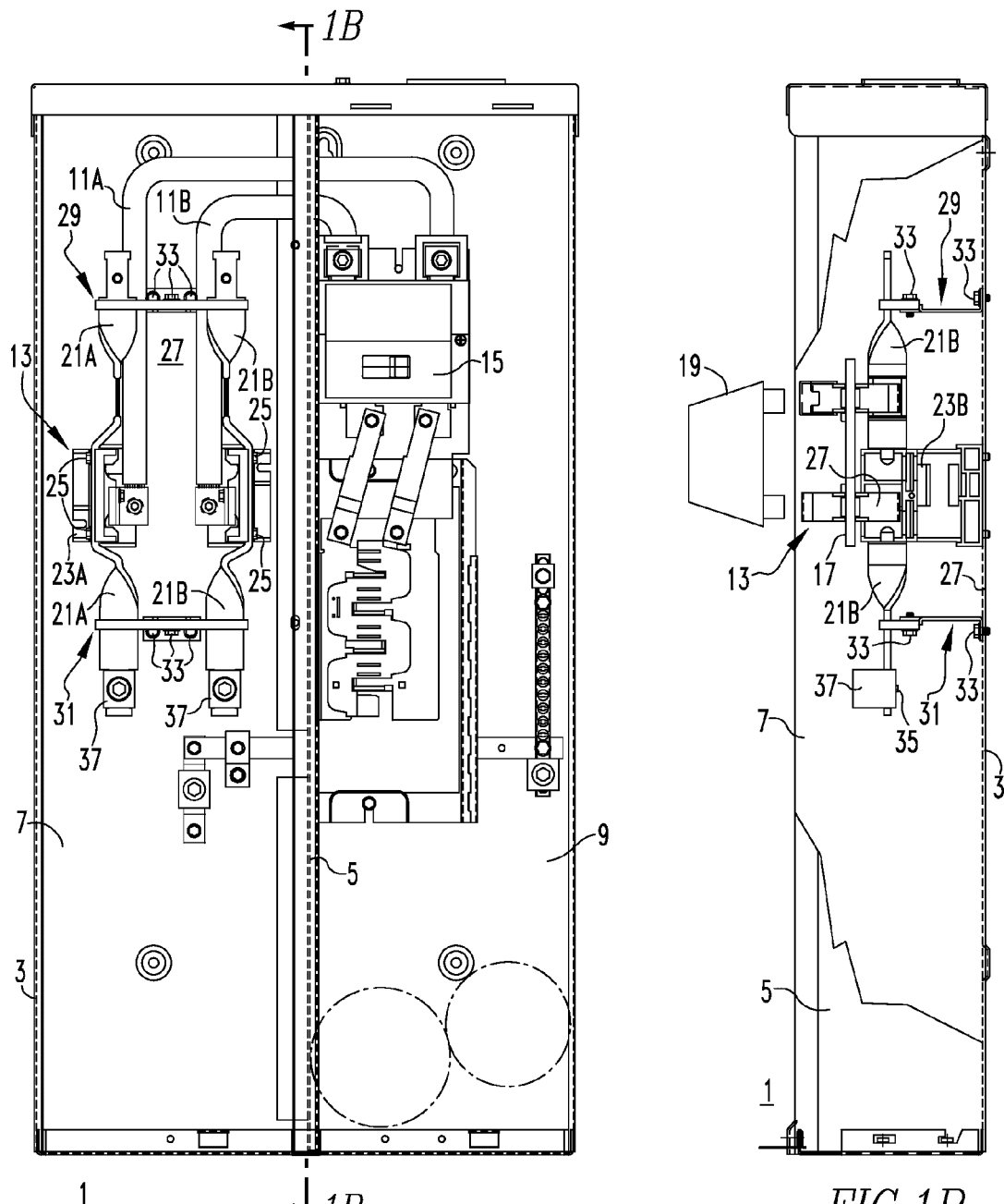
FIG. 1A is a vertical elevation view of a meter center and meter socket assembly therefor.
FIG. 1B is a partially exploded, cross-sectional view taken along line 1B-1B of FIG. 1 and modified to also show a meter.

For purposes of illustration, embodiments of the invention will be described as applied to a meter center including a single meter socket assembly, although it will become apparent that they could also be applied to meter centers having any suitable number and configuration of meter socket assemblies.

Directional phrases used herein, such as, for example, front, back, top, bottom, upper, lower and derivatives thereof, relate to the orientation of the elements shown in the drawings and are not limiting upon the claims unless expressly recited therein.

As employed herein, the phrase "self-mounting and supporting" refers to the fact that the disclosed base assembly is independently mounted to the meter cabinet, without requiring separate mounting brackets, and that it provides support for the electrical bus members such as, for example and without limitation, the line buses of the meter socket assembly, without requiring separate fasteners to secure the electrical bus members to the base assembly. In this regard, the electrical bus members are also "self-supporting" as they do not require the use of a separate number of fasteners in order to be coupled to the base assembly in the desired orientation.

As employed herein, the phrase "quick change" refers to the ability to rapidly connect and disconnect, or remove and/or exchange or replace a component without first requiring removal, loosening or other manipulation of a number of separate fasteners.

As employed herein, the term "fastener" shall mean a separate element or elements which is/are employed to connect or tighten two or more components together, and expressly includes, without limitation, rivets, pins, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the term "number" refers to the quantity one or an integer greater than one (i.e., a plurality).

Figure 2:
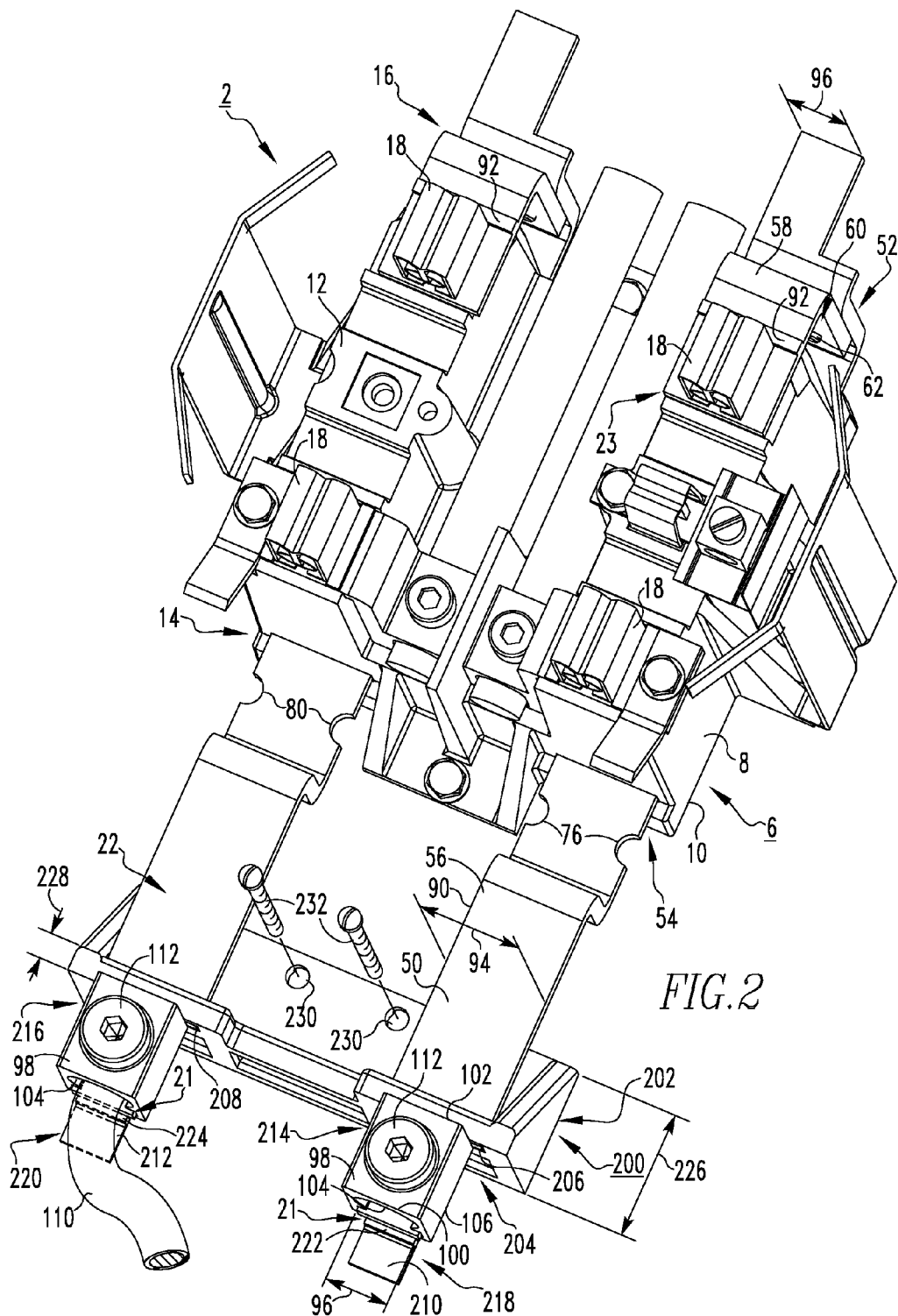
FIG. 2 is an isometric view of a meter socket assembly and self-mounting and supporting base assembly therefor, in accordance with an embodiment of the invention.
Figure 3A:
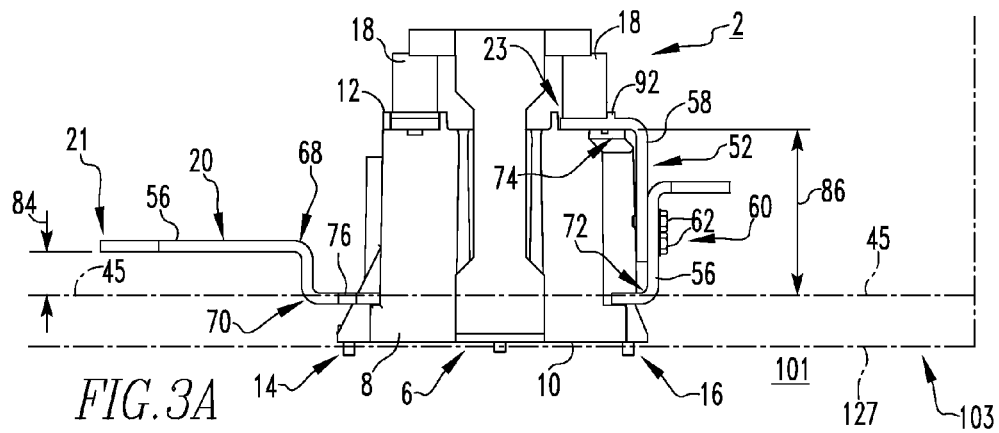
FIGS. 3A, 3B and 3C are side elevation, end elevation, and bottom plan views of the meter socket assembly and self-mounting and supporting base assembly therefor of FIG. 2.

FIG. 2 shows a meter socket assembly 2 including a base assembly 6 for a meter center 101 (partially shown in simplified form in FIG. 3A). The base assembly 6 includes a base member 8 which is structured to be coupled to a panel member 127 of the enclosure 103 of the meter center 101, as shown in FIG. 3A. The base member 8 may be similar to that which is disclosed in U.S. Patent Application Publication No. 2006/0063423, entitled "Consolidated Meter Socket Support Base," published Mar. 23, 2006, which is hereby incorporated herein by reference.

Figure 3B:
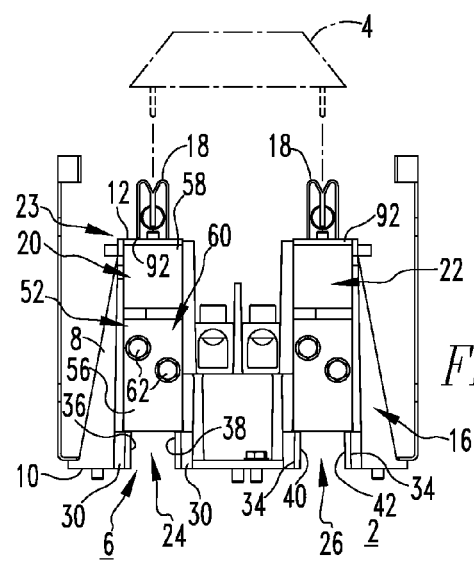
Figure 3C:
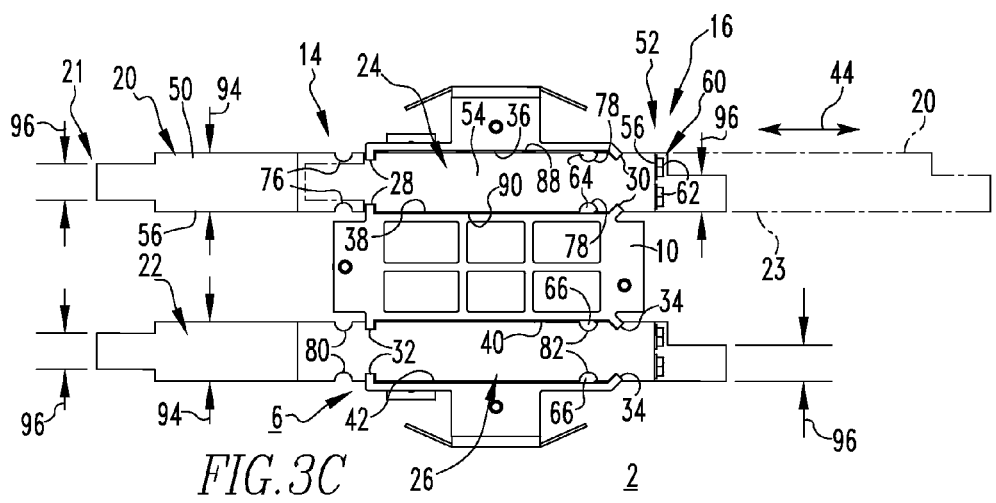

As best shown in FIGS. 2 and 3A-3C, the base member 8 of the base assembly 6 of the example meter socket assembly 2 includes a first side 10 which is coupled to the panel member 127 (FIG. 3A) of the meter center 101 (FIG. 3A), a second side 12 (FIGS. 2, 3A and 3B), which is disposed opposite and distal from the first side 10, a first end 14 (FIGS. 2, 3A and 3C) and a second end 16. A number of meter jaws 18 (FIGS. 2, 3A and 3B) are disposed on the second side 12 (FIGS. 2, 3A and 3B) of the base member 8, and are structured to receive a meter 4 (shown in simplified form in phantom line drawing in FIG. 3B). A number of electrical bus members, such as the first and second electrical bus members 20,22 (only electrical bus member 20 is shown in FIG. 3A) are coupled to the base member 8 at or about the first side 10 thereof, as best shown in FIGS. 3B and 3C, and are electrically connected to at least one of the meter jaws 18 at or about the second side 12 of the base member 8, (as best shown in FIGS. 2, 3A and 3B). The base member 8 of the example base assembly 6 shown and described herein, is a single piece electrically insulative member. It will, therefore, be appreciated that the base member 8 can be made from any known or suitable electrically insulative material such as, for example and without limitation, molded plastic.

The electrical bus members 20,22 are coupled to and supported by the base member 8 of the base assembly 6, without the use of a number of separate fasteners. Specifically, as best shown in FIGS. 3B and 3C, the first side 10 of the base member 8 includes a number of channels 24,26. Each of the channels 24,26 receives a corresponding one of the electrical bus members 20,22, as shown. In the example shown and described herein, the first side 10 of base member 8 includes first and second channels 24,26 which extend between the first and second ends 14,16 (only second end 16 is shown in FIG. 3B) of the base member 8. The first and second electrical bus members 20,22 are disposed within the first and second channels 24,26, respectively, and thus, also extend between the first and second ends 14,16 of the base member 8, as best shown in FIG. 3C. As best shown in FIG. 3B, the first and second electrical bus members 20,22 are offset (e.g., spaced away from) the first side 10 of the base member 8. In this manner, the first and second channels 24,26 also serve to advantageously insulate the first and second electrical bus members 20,22, for example, from undesirably shorting with respect to one another or with respect to nearby components of the meter socket assembly 2 which are electrically conductive.

The electrical bus members 20,22 are held in place within the channels 24,26 of the first side 10 of base member 8 by a plurality of protrusions 28,30,32,34, which are disposed at or about each of the first and second channels 24,26. As best shown in FIG. 3C, the example protrusions 28,30,32,34 comprise a pair of first molded tabs 28 extending inwardly at or about the first end 14 of base member 8 in order to at least partially overlay the first channel 24, a pair of second molded tabs 30 extending inwardly at or about the second end 16 of base member 8 in order to at least partially overlay the first channel 24, a pair of third molded tabs 32 extending inwardly at or about the first end 14 of base member 8 in order to at least partially overly the second channel 26, and a pair of fourth molded tabs 34 extending inwardly at or about the second end 16 of the base member 8 in order to at least partially overlay the second channel 26. More specifically, the first and second channels 24,26 also include respective first and second opposing sidewalls 36,38 and 40,42. Each tab of the pair of first molded tabs 28 and each tab of the pair of third molded tabs 32 extends substantially perpendicularly inwardly from the first and second opposing sidewalls 36,38 and 40,42 of the first and second channels 24 and 26, respectively. Each tab of the pair of second molded tabs 30, and each tab of the pair of fourth molded tabs 34 extends inwardly from a corresponding one of the first and second opposing sidewalls 36,38 and 40,42 of the first and second channels 24 and 26, respectively, at an angle of about 45 degrees with respect to the first and second opposing sidewalls 36,38 and 40,42, as shown.

The electrical bus members 20,22 will now be described in greater detail. For simplicity of disclosure and ease of illustration, only one electrical bus member 20 will be described in detail. It will, however, be appreciated that the other electrical bus member 22 is substantially similar. Specifically, referring to FIGS. 2, 3A, 3C, and 4, the electrical bus member 20 includes a first end 21 (see also FIG. 7), a second end 23 (shown in phantom line drawing in FIG. 4) (see also FIG. 3B), and a plurality of bends 68,70,72,74 (best shown in FIG. 3A) (bend 74 is shown in phantom line drawing in FIG. 4) therebetween. Such bends 68,70,72,74 define a first portion 50 of the electrical bus member 20 which is disposed at or about the first end 21 of the electrical bus member 20, a second portion 52 disposed at or about the second end 23 of the electrical bus member 20, and an intermediate portion 54 extending between the first and second portions 50,52. The first portion 50 extends outwardly from the first end 14 of the base member 8, as best shown in FIGS. 2, 3A, 3C and 7. The second portion 52 extends between the first and second sides 10,12 of the base member 8, at or about the second end 16 of the base member 8, in order to be electrically connected to the meter jaw 18 on the second side 12, as best shown in FIGS. 2, 3A and 3B. The intermediate portion 54 extends between the first and second ends 14,16 of the base member 8, at or about the first side 10 of the base member 8, in order to interconnect the first and second portions 50,52 (best shown in FIG. 3C), as previously discussed.

Figure 4:
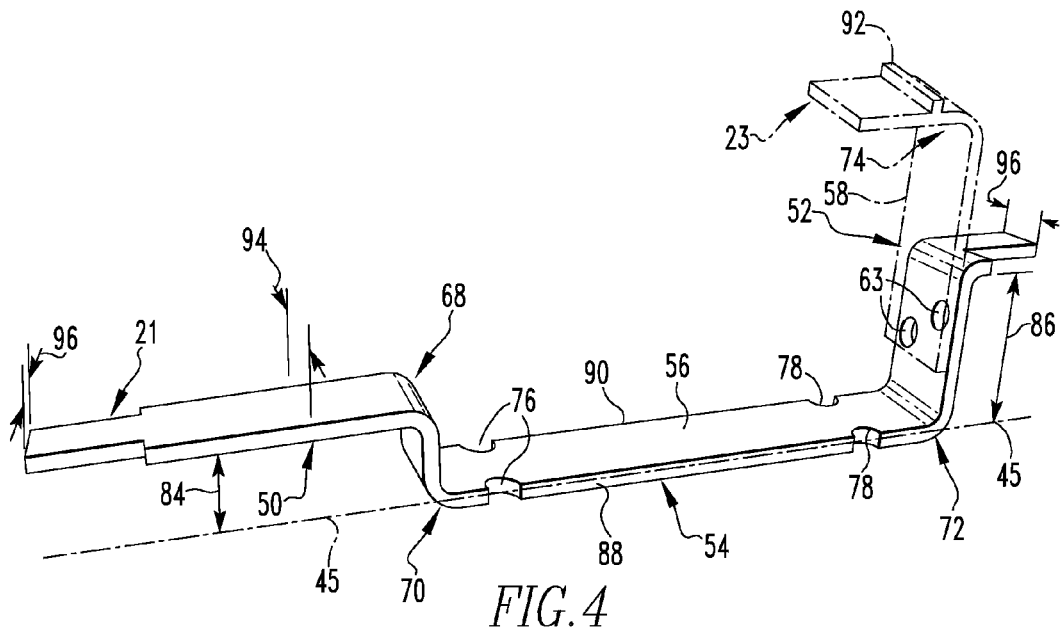
FIG. 4 is an isometric view of a self-supporting bus member.

The example electrical bus member 20 comprises a first part 56, a second part 58 (shown in phantom line drawing in FIG. 4), and a fastening mechanism 60 for fastening the first and second parts 56,58 together. Specifically, the first part 56 of the electrical bus member 20 is shown and described with respect to FIGS. 2, 3A, 3C, 4 and 7. The first part 56 of the electrical bus member 20 comprises the first portion 50 and the intermediate portion 54 of the electrical bus member 20, whereas the second part 58 of the electrical bus member 20 comprises the second portion 52 (FIGS. 2 and 3A-3C) of the electrical bus member 20. The fastener mechanism 60 in the example meter socket assembly 2 shown and described herein, is a number of fasteners 62. Specifically, two suitable fasteners 62 are inserted through the second part 58 of the electrical bus member 20 and into the first part 56 of the electrical bus member 20, and fastened, in order to electrically connect the first and second parts 56,58. As shown in FIG. 4, the electrical bus member 20 includes holes 63 which are structured to receive the fasteners 62 (FIGS. 2 and 3A-3C) therethrough. It will, however, be appreciated that any known or suitable alternative fastener or fastening mechanism, as defined herein, could be employed in any suitable number and configuration.

Accordingly, the aforementioned electrical bus member 20 and thus the meter socket assembly 2 is adaptable to be interchangeable between an underground feed configuration (shown in FIGS. 2, 3A, in solid line drawing in FIGS. 3C, and 7), wherein the utility lines (see electrical conductor 110 partially shown in FIG. 2) which are electrically connected to the meter socket assembly 2 are structured to be electrically connected below (from the perspective of FIG. 2) the meter socket assembly 2 at or about the first end 21 of the electrical bus member 22, and an overhead feed configuration (see, for example, electrical bus member 20 shown in phantom line drawing in FIG. 3C), wherein the utility lines (not shown) are structured to be electrically connected to the meter socket assembly 2 above (from the perspective of FIG. 2; to the right from the perspective of FIG. 3C); the meter socket assembly 2 at or about the second ends 23 of the electrical bus members 20,22. It will, however, be appreciated that the electrical bus member 20 could employ any known or suitable alternative configuration, without departing from the scope of the invention. For example and without limitation, the electrical bus member could alternatively comprise a single piece of material 20', as shown in the example of FIG. 5, which will now be discussed.

Figure 5:
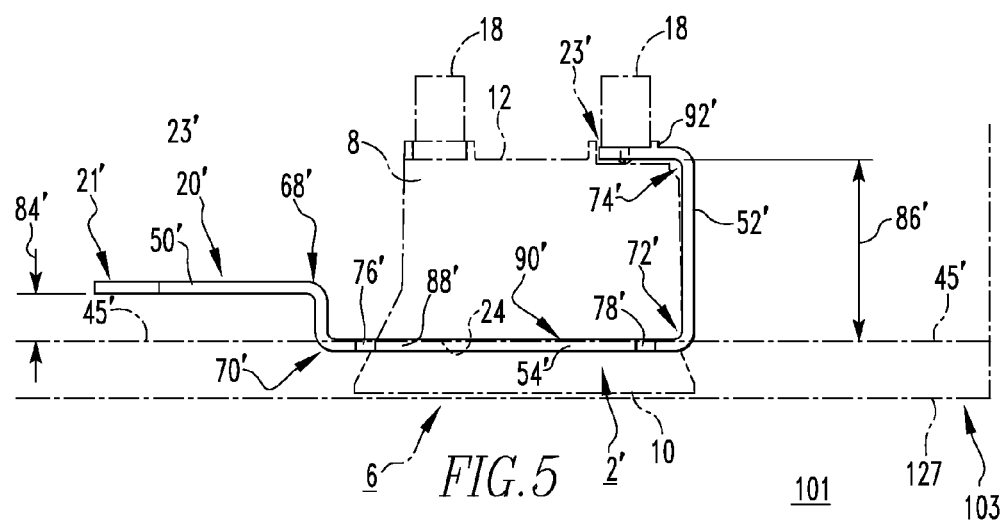
FIG. 5 is a side elevation view of a self-supporting bus member.

Specifically, a single piece electrical bus member 20', which is structured for use in an underground feed configuration of the meter socket assembly 2, is shown in FIG. 5. The first portion 50', second portion 52' and intermediate portion 54' of the electrical bus member 20' are all integral sections of a single piece of material. Apart from this fact, the remainder of the electrical bus member 20' is substantially similar to electrical bus member 20, previously discussed in connection with FIGS. 2, 3A-3C, 4 and 7. Specifically, the electrical bus member 20' includes a plurality of bends 68',70',72',74' in order to define the first, second and intermediate portions 50',52',54' thereof. The single piece of material of the electrical bus member 20' extends from the meter jaw 18 (shown in simplified form in phantom line drawing in FIG. 5) of the second side 12 of the base member 8 (shown in simplified form in phantom line drawing in FIG. 5) of the meter socket assembly 2'. It then extends from the second side 12 toward the first side 10 of the base member 8. Next, it extends between the first side 10 and the panel member 127 of the meter center 101, from the second end 16 of the base member 8 toward the first end 14 of the base member 8. Finally, it extends from the first side 10 of the base member 8 toward the second side 12 of the base member 8, and turns to extend generally perpendicularly outwardly from the first end 14, as shown. The intermediate portion 54' of the electrical bus member 20' includes a number of recesses 76',78' which, similar to recesses 76,78 which will be discussed hereinbelow with respect to electrical bus member 20 (FIG. 4), are structured to receive the protrusion 64,66 (FIG. 3C) of the base member 8 of the meter socket assembly 2, in order that the electrical bus member 20' is coupled to and supported by the base member 8 of the meter socket assembly 2.

In this manner, the electrical bus member 20' is self-supporting, as defined herein. The intermediate portion 54' of electrical bus member 20' also has a longitudinal axis 45'. As shown, the first portion 50' of the electrical bus member 20' is offset a first distance 84' with respect to longitudinal axis 45', and the top (from the perspective of FIG. 5) of the second portion 52' of electrical bus member 20' is offset a second distance 86' with respect to longitudinal axis 45'. The first distance 84' is less than the second distance 86' in the example of FIG. 5. In other words, the electrical bus member 20' is structured to generally extend along the first side 10 of the base member 8 of the meter socket assembly 2' and proximate at least a portion of the first end 14 of the base member 8 and proximate at least a portion of the second end 16 of the base member 8. In this manner, the electrical bus member 20' at least partially surrounds the base member 8, as shown.

Referring again to FIGS. 3A and 4, it will be appreciated that like the longitudinal axis 45' of electrical bus member 20' discussed with respect to FIG. 5, the intermediate portion of the aforementioned two part electrical bus member 20 also includes longitudinal axis 45, and that the first and second portions 50,52 of the electrical bus member 20 are offset with respect to longitudinal axis 45 a first distance 84 and a second distance 86, respectively. The second distance 86 is greater than the first distance 84. Specifically, as best shown in FIG. 3A, the second part 58 of the electrical bus member 20 extends from the meter jaw 18 of the second side 12 of base member 8 of the meter socket assembly 2 toward the first side 10 of the base member 8. The first part 56 of the electrical bus member 20 overlaps a portion of the second part 58 of the electrical bus member 20 at or about the second end 16 of the base member 8, as shown. It then extends from the second end 16 to the base member 8 toward the first side 10 of the base member 8, between the first side 10 of base member 8 and the panel member 127 of the meter center 101, and from the second end 16 of the base member 8 toward the first end 14 of the base member 8. Finally, the first part 56 of the electrical bus member 20 extends from the first side 10 of the base member 8 toward the second side 12 of the base member 8, and turns to extend generally perpendicularly outwardly from the first end 14, as shown. As previously discussed, the fastener 62 are received through the first and second parts 56,58 of the electrical bus member 20, and fastened, in order to secure the first and second parts 56,58 together at or about the second end 16 of the base member 8 where they overlap.

The electrical bus member 20 in the example of FIGS. 2, 3A and 3B, further includes a protrusion 92 (see also protrusion 92' of electrical bus member 20' of FIG. 5) which is disposed at or about the second end 23 of the electrical bus member 20, and is structured to be disposed adjacent the corresponding meter jaw 18 to which the electrical bus member 20 is electrically connected on the second side 12 of the base member 8 of the meter socket assembly 2. In this manner, the protrusion 92 resists undesired movement (e.g., without limitations, rotation) of the meter jaw 18, and to maintain the desired position of the electrical bus member 20 with respect thereto. It will be appreciated that although the protrusion 92 is contemplated as comprising an integral section of the same single piece of material that comprises the second part 58 of the electrical bus member 20, that any known or suitable alterative mechanism or structure could be employed to resist undesired movement of the meter jaw 18, without departing from the scope of the invention.

In addition to being self-supporting, the electrical bus member 20 is also preferably adjustable with respect to the base member 8 of the meter socket assembly 2. Specifically, the intermediate portion 54 of the electrical bus member 20 includes a plurality of recesses 76,78,80,82 (FIG. 3C). The examples recesses 76,78,80,82 comprise a plurality of arcuate cutouts disposed on the first and second opposing edges 88,90 (FIGS. 2, 3C, 4 and 7) of the electrical bus member 20. The arcuate cutouts 76,78,80,82 are structured to receive the protrusion 64,66 of the base member 8 of the meter socket assembly 2, in order to fasten the electrical bus member 20 in a desired position with respect to the base member 8, without the use of the numbers of separate fasteners, as best shown in FIG. 3C. More specifically, the arcuate cutouts include at least two pairs of opposing arcuate cutouts 76,78,80,82, wherein a first pair or opposing arcuate cutouts 76 is disposed proximate the first portion 50 of the electrical bus member 20, and a second pair of opposing arcuate cutouts 78 is disposed proximate the second portion 52 of the electrical bus member 20. When the first and second pairs of arcuate cutouts 76,78 are disengaged from the protrusions 64 of base member 8 of the meter socket assembly 2, the electrical bus member 20 is adjustable with respect to the base member 8 by movement of the electrical bus member 20 to a different position (shown in phantom line drawing in FIG. 3C) in which the other pair of opposing arcuate cutouts 76 is engaged by the protrusions 64. Thus, it will be appreciated that the electrical bus members 20,22 of the example meter socket assembly 2 are adjustable in the directions generally indicated by arrow 44 (FIG. 3C). It will also be appreciated that such adjustment can be provided without first requiring the removal, loosening or other manipulation of a plurality of separate fasteners, as defined herein. In this manner, the meter socket assembly 2 may be quickly and easily adjusted for use in either of the aforementioned underground or overhead feed configurations previously discussed.

As shown in FIGS. 2, 3C and 4, the electrical bus member 20 also has a first width 94, and at least one of the first end 21 of the electrical bus member 20 and the portion of the electrical bus member 20 at or about the second end 16 of the base member 8 of the meter socket assembly 2 has a second width 96. The second width 96, is less than the first width 94 in order to receive an electrical connector 98, as shown in FIGS. 2 and 7. The example meter socket assembly 2 includes a quick change mechanism 200 (FIGS. 2, 6 and 7) for facilitating the connection and removal of such electrical connectors 98 from the electrical bus members 20,22 (FIGS. 2 and 7).

Figure 6:
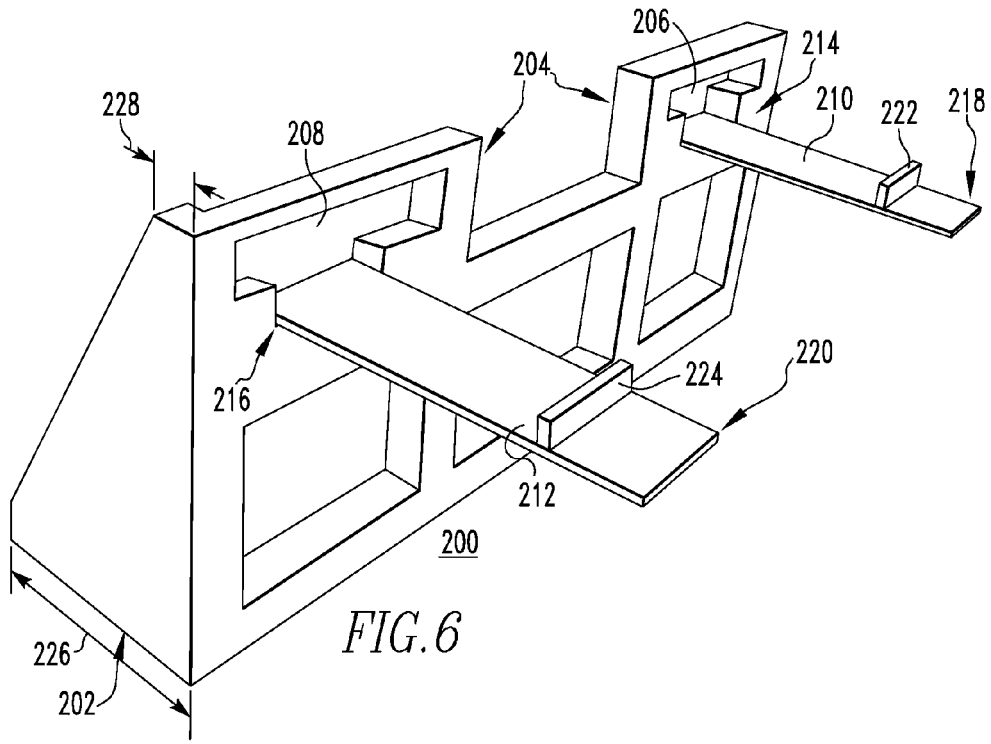
FIG. 6 is an isometric view of a quick change mechanism.
Figure 7:
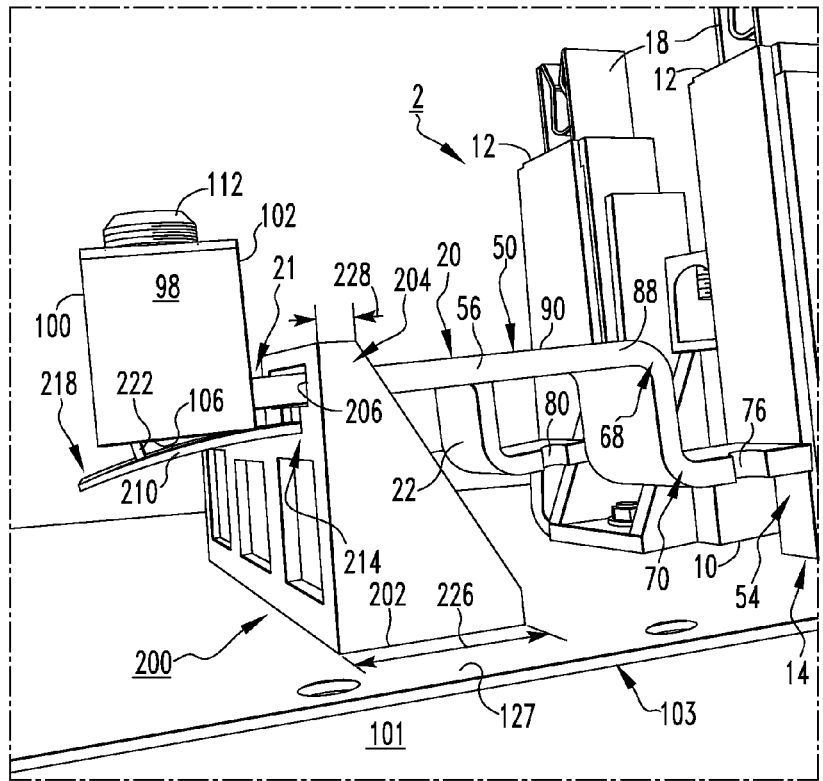
FIG. 7 is an isometric view of the quick change mechanism of FIG. 6 shown removably engaging an electrical connector.

Specifically, as best shown in FIGS. 6 and 7, the quick change mechanism 200 includes a foundation 202, which is structured to be disposed at or about the panel member 127 of the meter center 101, and a receiving portion 204 disposed generally opposite and distal from the foundation 202. The receiving portion 204 includes a number of apertures 206, 208, each structured to receive a corresponding one of the electrical bus members 20,22 of the meter socket assembly 2, as shown in FIGS. 2 and 7. A number of resilient protrusions 210,212 extend outwardly from the receiving portion 204 of the quick change mechanism 200, and are structured to be operable between a non-deflected position (FIG. 6) corresponding to the resilient protrusions 210,212 securing a corresponding one of the electrical connectors 98 (FIGS. 2 and 7) on the electrical bus member 20 (FIGS. 2 and 7), and a deflected position (FIG. 7) corresponding to the resilient protrusion 210 being deflected away from the electrical connector 98, in order that the electrical connector 98 is removable from the electrical bus member 20. The example quick change mechanism 200 comprises one single piece of material, such as the electrically insulative molded member 200, which is shown. The foundation 202 of the quick change mechanism 200 and the receiving portion 204 of the quick change mechanism 200 comprise integral sections of the one single piece of material.

Continuing to refer to FIG. 6, the resilient protrusions of the example quick change mechanism 200 comprise deflectable legs 210,212 each having a first end 214,216 coupled to the receiving portion 204 of the quick change mechanism 200 at or about a corresponding one of the apertures 206,208 thereof, a second end 218,220 disposed opposite and distal from the first end 214,216 of the deflectable leg 210,212, and a protrusion 222,224 disposed proximate the second end 218, 220 of the deflectable leg 210,212. The protrusion 222 comprises a tab extension which, when the deflectable leg 210 is disposed in the undeflected position (FIGS. 2 and 6), is structured to be disposed adjacent a portion of the corresponding electrical connector 98 (FIGS. 2 and 7), in order to retain the electrical connector 98 (FIGS. 2 and 7) on the electrical bus member 20, without the use of a number of separate fasteners. The deflectable leg 210 extends generally perpendicularly outwardly from the receiving portion 204 of the quick change mechanism 200 and, when the deflectable leg 210 is disposed in undeflected position, it is substantially straight and is structured to be generally parallel with respect to the corresponding electrical bus member 20 (FIG. 7). The tab extension 222 extends generally perpendicularly outwardly from the deflectable leg 210. When the deflectable leg 210 is disposed in the deflected position of FIG. 7, the second end 218 of the deflectable leg 210 is bent away from the corresponding electrical bus member 20 as shown.

In the example shown and described herein, the number of apertures 206,208 of the receiving portion 204 of the quick change mechanism 200 is a first aperture 206 and a second aperture 208, and the number of resilient protrusions 210,212 of the quick change mechanism 200 is a first deflectable leg 210 and a second deflectable leg 212, wherein the first deflectable leg 210 extends generally perpendicularly outwardly from the receiving portion 204 of the quick change mechanism 200 at or about the first aperture 206, and the second deflectable leg 212 extends generally perpendicularly outwardly from the receiving portion 204 of the quick change mechanism 200 at or about the second aperture 208. It will, however, be appreciated that the receiving portion 204 of the quick channel mechanism 200 could employ any suitable number and configuration of apertures other than the first and second apertures 206,208 shown and described herein. Accordingly, it will be appreciated that the quick change mechanism 200 could be adapted for use with any suitable count and/or configuration of electrical bus members other than the first and second electrical bus members 20,22 (FIGS. 2 and 7) shown and described herein. It will still further be appreciated that although the first and second apertures 206, 208 are contemplated as comprising generally rectangular-shaped apertures for receiving the first and second electrical bus members 20,22, respectively, that the electrical bus members 20,22 and apertures 26,28 for receiving the same, could have any known or suitable alternative shape and/or count, without departing from the scope of the invention.

As shown in FIGS. 2 and 7, each of the electrical connectors 98 (one electrical connector 98 is shown in FIG. 7) includes a first end 100, a second end 102 disposed opposite the first end 100, a hole 104 (FIG. 2) extending between the first end 100 and the second end 102, and a base 106. The hole 104 (FIG. 2) of the electrical connector 98 is structured to receive the corresponding electrical bus member 20,22, as best shown in FIG. 2. When deflectable leg 210,212 is disposed in the undeflected position of FIG. 2, the tab extension 222,224 of the deflectable leg 210,212 is disposed adjacent the first end 100 of the corresponding electrical connector 98 in order to resist unintentional removal of the electrical connector 98. The base 106 of the example electrical connector 98 rests on the deflecting leg 210 when the deflectable leg 210 is disposed in undeflected position. Accordingly, as previously discussed, removal and/or electrical connection of the electrical connector 98 can be accomplished by way of the quick change mechanism 200, without first requiring the removal, loosening or other manipulation of a separate number of fasteners.

The quick change mechanism 200 also serves a number of other advantageous functions. Specifically, it is structured to support the electrical bus members 20,22 of the meter socket assembly 2, and to resist the undesired rotation of the electrical bus members 20,22. In particular, the foundation of the quick change mechanism 200 has a first width 226, and the receiving portion 204 of the quick change mechanism 200 has a second width 228. The first width 226 of the foundation 202 is greater than the second width 228 of the receiving portion 204 and, as best shown in FIGS. 6 and 7, the foundation 202 of the example quick change mechanism 200 tapers from the first width 226 of the foundation 202 to the second width 228 of the receiving portion 204. Thus, the foundation 202 is structured to abut the panel member 127 (FIGS. 2 and 7) of the meter center 101 (FIGS. 2 and 7) such that it supports the electrical bus members 20,22. This, and the fact that the apertures 206,208 of the receiving portion 204 of the quick change mechanism 200 secure the electrical bus members 20,22 therein, results in the quick change mechanism 200 also serving to resist undesired rotation of the electrical bus members 20,22 (FIGS. 2 and 7). The foundation 202 of the example quick change mechanism 200 further includes at least one hole 230 (two holes 230 are shown in FIG. 2) and a number of fastener 232 (shown in exploded orientation with respect to holes 230 in FIG. 2). Each of the fasteners 232 is received by a corresponding one of the holes 230 of the foundation 202, and is structured to fasten the foundation 202 to the panel member 127 of the meter center 101, thereby further securing the electrical bus members 20,22 thereof.

Accordingly, among other benefits, the disclosed meter socket assembly 2 provides an improved self-mounting and supporting base assembly 6, self-supporting electrical bus members 20,22 therefor, and a unique quick change mechanism 200. The quick change mechanism 200 permits the electrical connectors 98 to be quickly and easily connected to and disconnect from the electrical bus members 20,22 without first requiring the removal, loosening or other manipulation of a number of separate fasteners. The disclosed meter socket assembly 2 and, in particular, the self-mounting and supporting base assembly 6 thereof, also effectively supports, secures and prevents undesired rotation of the electrical bus member 20,22, and allows for relatively quick and easy adjustment of the electrical bus members 20,22, without requiring the removal, loosening or other manipulation of a plurality of fasteners.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A base assembly for a meter socket assembly of a meter center including an enclosure having a panel member, said meter socket assembly structured to receive a meter, said base assembly comprising:
   a base member including a first side, a second side disposed opposite and distal from the first side, a first end and a second end, the first side of said base member being structured to be coupled to said panel member of said enclosure of said meter center;
   a number of meter jaws disposed on the second side of said base member and being structured to receive said meter of said meter socket assembly;
   a number of electrical bus members, each of said electrical bus members being coupled to said base member at or about the first side of said base member and being electrically connected to at least one of said meter jaws at or about the second side of said base member,
   wherein said electrical bus members are coupled to and supported by said base member of said base assembly, without the use of a number of separate fasteners.

2. The base assembly of claim 1 wherein said base member comprises a single piece, electrically insulative member.

3. The base assembly of claim 1 wherein the first side of said base member comprises a number of channels; and wherein each of said channels receives a corresponding one of said electrical bus members.

4. The base assembly of claim 3 wherein said number of electrical bus members comprises first and second electrical bus members; wherein said number of channels comprises first and second channels; wherein said first and second channels are disposed on the first side of said base member; wherein said first and second channels extend between the first end of said base member and the second end of said base member; wherein said first and second electrical bus members are disposed within said first and second channels, respectively; and wherein each of said first and second electrical bus members extends between the first end of said base member and the second end of said base member.

5. The base assembly of claim 4 wherein the first side of said base member further comprises a plurality of protrusions disposed at or about each of said first and second channels; and wherein said protrusions are structured to retain said first and second electrical bus members within said first and second channels, respectively.

6. The base assembly of claim 5 wherein said protrusions comprise a pair of first molded tabs extending inwardly at or about the first end of said base member in order to at least partially overlay one of said first and second channels, a pair of second molded tabs extending inwardly at or about the second end of said base member in order to at least partially overlay said one of said first and second channels, a pair of third molded tabs extending inwardly at or about the first end of said base member in order to at least partially overlay the other one of said first and second channels, and a pair of fourth molded tabs extending inwardly at or about the second end of said base member in order to at least partially overlay said other one of said first and second channels.

7. The base assembly of claim 6 wherein each of said first and second channels includes first and second opposing sidewalls; wherein each of said pair of first molded tabs and each tab of said pair of third molded tabs extend substantially perpendicularly inwardly from said first and second opposing sidewalls of said first and second channels, respectively; and wherein each of said pair of second molded tabs, and each tab of said pair of fourth molded tabs extend inwardly from a corresponding one of said first and second opposing sidewalls of said first and second channels, respectively, at an angle of about 45 degrees with respect to said corresponding one of said first and second opposing sidewalls.

8. The base assembly of claim 1 wherein each electrical bus member of said electrical bus members comprises a first portion extending outwardly from the first end of said base member, a second portion extending between the first side of said base member and the second side of said base member at or about the second end of said base member in order to be electrically connected to said at least one of said meter jaws on the second side of said base member, and an intermediate portion extending between the first end of said base member and the second end of said base member at or about the first side of said base member in order to interconnect said first portion of said electrical bus member and said second portion of said electrical bus member.

9. The base assembly of claim 8 wherein said electrical bus member is a single piece of material; and wherein said first portion of said electrical bus member, said second portion of said electrical bus member, and said intermediate portion of said electrical bus member are all integral sections of said single piece of material.

10. The base assembly of claim 8 wherein said electrical bus member comprises a first part, a second part, and a fastening mechanism structured to fasten said first part to said second part; wherein said first part of said electrical bus member comprises said first portion of said electrical bus member and said intermediate portion of said electrical bus member; and wherein said second part of said electrical bus member comprises said second portion of said electrical bus member.

11. The base assembly of claim 10 wherein said fastening mechanism is a number of fasteners; and wherein said fasteners are inserted through said second part of said electrical bus member and into said first part of said electrical bus member and fastened in order to electrically connect said first part to said second part.

* * * * *